(12) United States Patent
Muto

(10) Patent No.: US 10,636,658 B1
(45) Date of Patent: Apr. 28, 2020

(54) METHODS OF FORMING PATTERNS, AND METHODS OF PATTERNING CONDUCTIVE STRUCTURES OF INTEGRATED ASSEMBLIES

(71) Applicant: Micron Technology, Inc., Boise, ID (US)

(72) Inventor: Akira Muto, Hiroshima (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/255,458

(22) Filed: Jan. 23, 2019

(51) Int. Cl.
| | | |
|---|---|---|
| *H01L 21/033* | (2006.01) | |
| *H01L 21/027* | (2006.01) | |
| *H01L 21/3213* | (2006.01) | |
| *H01L 21/311* | (2006.01) | |
| *H01L 27/108* | (2006.01) | |
| *H01L 23/528* | (2006.01) | |

(52) U.S. Cl.
CPC ...... *H01L 21/0337* (2013.01); *H01L 21/0276* (2013.01); *H01L 21/0332* (2013.01); *H01L 21/32139* (2013.01); *H01L 21/31116* (2013.01); *H01L 23/528* (2013.01); *H01L 27/108* (2013.01)

(58) Field of Classification Search
CPC ... H01L 23/528; H01L 21/311; H01L 27/108; H01L 21/76; H01L 27/10826; H01L 27/10879; H01L 29/41791; H01L 21/823431; H01L 21/823821; H01L 221/0337

See application file for complete search history.

(56) References Cited

U.S. PATENT DOCUMENTS

| | | | | |
|---|---|---|---|---|
| 8,852,851 | B2 | 10/2014 | Zhou et al. | |
| 2012/0292716 | A1* | 11/2012 | Liu | H01L 27/10823 257/401 |
| 2014/0273433 | A1* | 9/2014 | Lee | H01L 21/76816 438/637 |
| 2018/0204834 | A1* | 7/2018 | Basker | H01L 21/82343 |
| 2018/0261456 | A1* | 9/2018 | Yang | H01L 21/32139 |

* cited by examiner

Primary Examiner — Zandra V Smith
Assistant Examiner — Andre C Stevenson
(74) *Attorney, Agent, or Firm* — Wells St. John P.S.

(57) ABSTRACT

Some embodiments include a method of forming a pattern. A first layer is formed to extend over a photoresist feature and along sidewalls of the photoresist feature. The first layer is etched to form first features. The photoresist feature is removed. A second layer is formed to extend over the first features and along sidewalls of the first features. The second layer is etched to form second features. A third layer is formed to extend over the first and second features and along sidewalls of the second features. A fourth layer is spin-coated over the third layer. A portion of the fourth layer is removed from over the first and second features. Segments of the third layer remain along the sidewalls of the second features. Regions of the fourth layer remain as blocks adjacent the segments. The first features and the segments are removed to leave the pattern.

24 Claims, 15 Drawing Sheets

METHODS OF FORMING PATTERNS, AND METHODS OF PATTERNING CONDUCTIVE STRUCTURES OF INTEGRATED ASSEMBLIES

TECHNICAL FIELD

Methods of forming patterns, and methods of patterning conductive structures of integrated assemblies.

BACKGROUND

Integrated assemblies may comprise patterned materials. For instance, patterned conductive materials may be utilized as wiring. The wiring may have many uses; including, for example, connecting peripheral circuitry to memory array circuitry, distributing signals and/or power across a die; coupling sensors to control circuitry and/or power circuitry, etc.

A continuing goal of integrated circuit fabrication is to increase the level of integration. Related goals are to shrink the dimensions of integrated components, and to reduce the spacing between integrated components.

It is becoming increasingly difficult to pattern wiring into the tightly-packed arrangements of next-generation integrated circuitry. Accordingly, it would be desirable to develop new patterning methods. Although the patterning methods may be particularly suitable for patterning wiring, it would be further desirable for such patterning methods to be generally suitable for patterning other integrated components as well.

DETAILED DESCRIPTION OF THE ILLUSTRATED EMBODIMENTS

Some embodiments include methods of forming highly-integrated patterns utilizing multiple sequentially-provided spacers. The patterns may be utilized for any suitable application, including, for example, fabrication of wiring. Example embodiments are described with reference to FIGS. 1-27.

Figure 1:
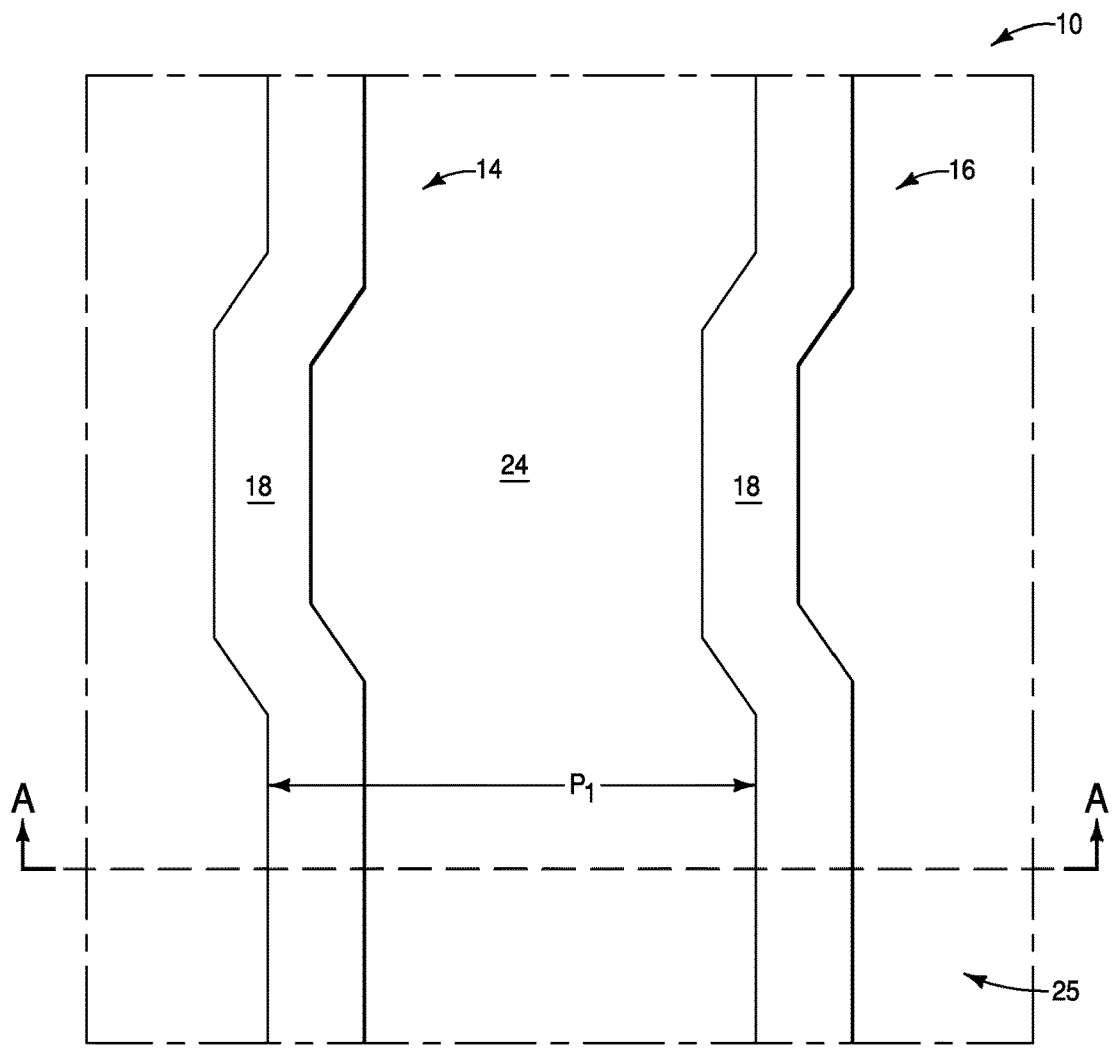
FIGS. 1 and 2 are a diagrammatic top view and a diagrammatic cross-sectional side view, respectively, of a region of an assembly at an example process stage of an example method for forming an example pattern. The view of FIG. 2 is along the line A-A of FIG. 1.
Figure 2:
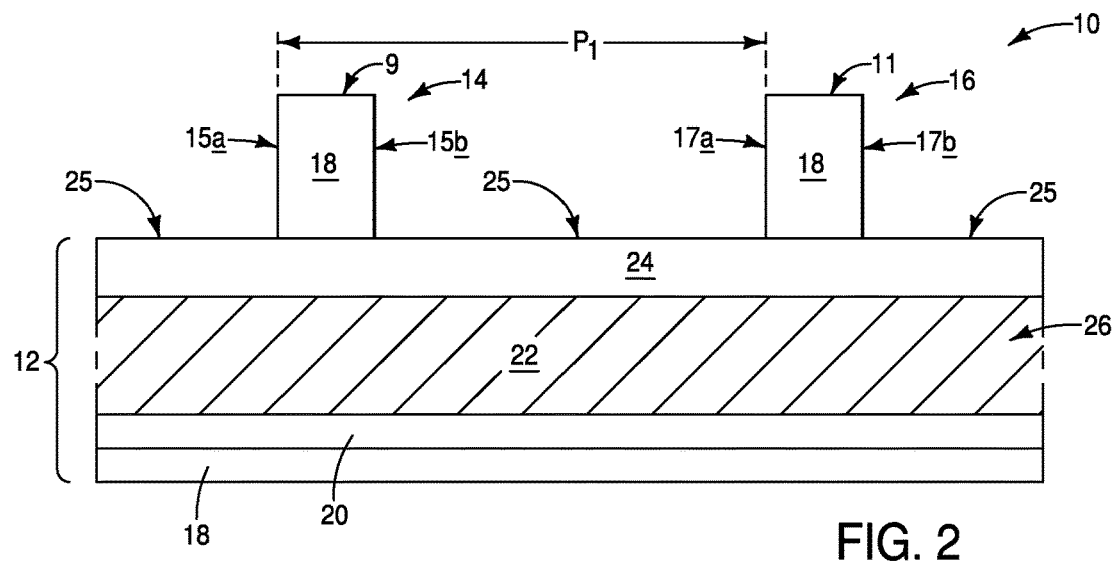

Referring to FIGS. 1 and 2, an assembly 10 is shown at an example process stage during an example method of forming an example pattern. The assembly includes a substrate 12, and a pair of patterned features 14 and 16 supported by the substrate 12.

The features 14 and 16 comprise patterned material 18. The material 18 may comprise any suitable composition(s); and in some embodiments may comprise, consist essentially of, or consist of photoresist. Example photoresist is polymeric organic material having photo-sensitive acid generator incorporated therein. The polymeric organic material may primarily comprise carbon and hydrogen (with the term "primarily comprise" meaning that more than 50 atomic percent of the material comprises the stated components), and in some applications the polymeric material may include one or more of acrylate, methacrylate, styrene, etc. The features 14 and 16 may be patterned utilizing conventional photolithographic-patterning methods. In embodiments in which the features 14 and 16 comprise photoresist, such features may be referred to as photoresist features.

The features 14 and 16 have sidewalls (or alternatively, sidewall surfaces) 15 and 17, respectively. Each of the features has a pair of opposing sidewalls along the cross-section of FIG. 2. The opposing sidewalls of the feature 14 are labeled as sidewalls 15a and 15b so that they may be distinguished from one another; and similarly the opposing sidewalls of the feature 16 are labeled as sidewalls 17a and 17b. In some embodiments, the sidewalls 15a and 15b may be referred to as first and second sidewalls, respectively, associated with the feature 14; and similarly the sidewalls 17a and 17b may be referred to as first and second sidewalls, respectively, associated with the feature 16.

The features 14 and 16 also have tops (or, alternatively, top surfaces) 9 and 11, respectively.

The features 14 and 16 are formed to a pitch Pi. Such pitch may be any suitable pitch. The features 14 and 16 are a starting point for forming a pattern, and may be considered to establish a template for the desired pattern. The actual pattern will be formed by providing multiple layers along locations established by the sidewalls of the features 14 and 16. The pitch Pi may be quite loose as compared to a pitch desired in the final pattern. Such may be advantageous, in that such may enable processing described herein to form a pattern having a pitch tighter than the limits of the photolithographic process utilized to establish the initial template.

Although the illustrated embodiment utilizes the pair of patterned photoresist features 14 and 16, it is to be understood that in other embodiments there may be only a single pattern photoresist feature (e.g., 14), or there may be more than two patterned photoresist features.

The substrate 12 is shown to comprise a base 18, an insulative material 20 over the base, a conductive material 22 over the insulative material, and a masking material 24 over the conductive material.

The base 18 may comprise semiconductor material; and may, for example, comprise, consist essentially of, or consist of monocrystalline silicon. The base 18 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 18 may correspond to a semiconductor substrate containing one or more materials associated with integrated circuit fabrication. Such materials may include, for example, one or more of refractory metal materials, barrier materials, diffusion materials, insulator materials, etc.

The insulative material 20 may comprise any suitable composition(s); and in some embodiments may comprise, consist essentially of, or consist of one or both of silicon dioxide and silicon nitride.

The conductive material 22 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 22 may be considered to be configured as an expanse (or layer) 26 supported by the base 18.

The masking material 24 may comprise any suitable composition(s); and in some embodiments may comprise one or more hard masking materials (e.g., amorphous carbon, silicon nitride, etc.), one or more antireflective materials (e.g., bottom antireflective material (BARC)), etc.

In the shown embodiment, the substrate 12 has an upper surface 25 extending between the features 14 and 16, and also extending outwardly of the features 14 and 16. The upper surface 25 is shown to be along the material 24. Accordingly, surface 25 may comprise any of the example compositions described above relative to the material 24; and in some embodiments may comprise BARC, amorphous carbon, silicon nitride, etc.

Figure 3:
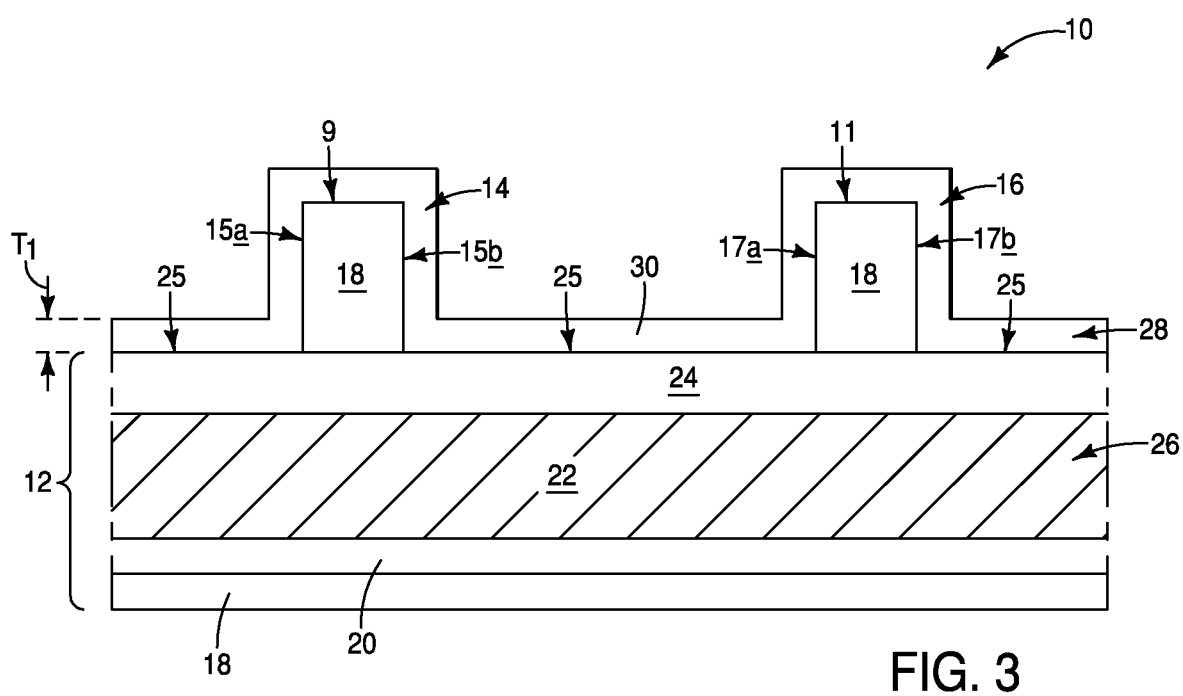
FIG. 3 is a diagrammatic cross-sectional side view of a region of the assembly of FIGS. 1 and 2 at a process stage subsequent to that of FIGS. 1 and 2.

Referring to FIG. 3, a layer 28 is formed to extend along the upper surface 25 of the substrate 12, along the top surfaces 9 and 11 of the photoresist features 14 and 16, and along the sidewalls 15 and 17 of the photoresist features. The layer 28 may be referred to as a first layer in some embodiments in order to distinguish it from other layers formed at later process stages.

The layer 28 comprises a material 30. Such material may comprise any suitable composition(s); and in some embodiments may comprise, consist essentially of, or consist of silicon dioxide. The material 30 may be referred to as a first material to distinguish it from other materials formed at later process stages; and the composition of material 30 may be referred to as a first composition to distinguish it from other compositions formed at later process stages.

The layer 28 may be formed to any suitable thickness $T_1$; and in some embodiments is formed to a thickness which is about one-twelfth of the initial pitch Pi (shown in FIGS. 1 and 2).

Figure 4:
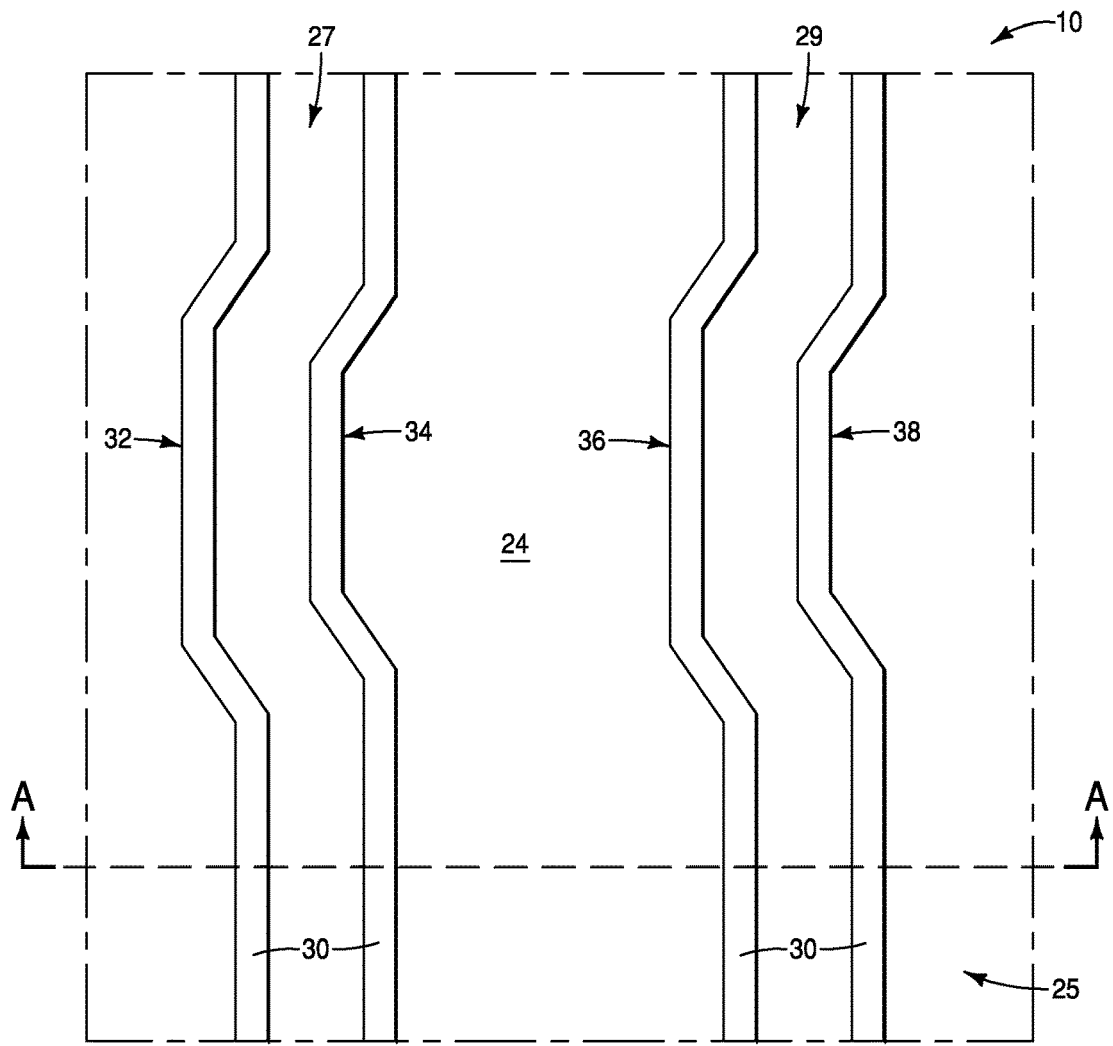
FIGS. 4 and 5 are a diagrammatic top view and a diagrammatic cross-sectional side view, respectively, of a region of the assembly of FIGS. 1 and 2 at a process stage subsequent to that of FIG. 3. The view of FIG. 5 is along the line A-A of FIG. 4.
Figure 5:
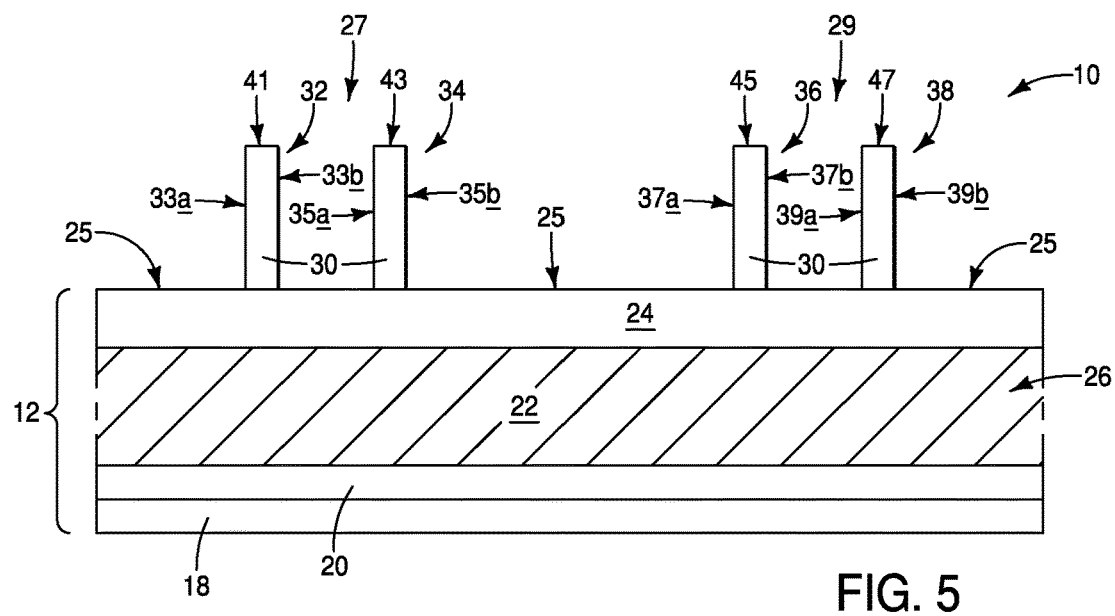

Referring to FIGS. 4 and 5, the layer 28 (FIG. 3) is anisotropically etched to form features 32, 34, 36 and 38 along the sidewalls 15 and 17 of the photoresist features 14 and 16 (with such sidewalls and photoresist features being shown in FIG. 3); and subsequently, the photoresist features are removed. The removal of the photoresist feature 14 (FIG. 3) leaves a gap 27 between the features 32 and 34; and the removal of the photoresist feature 16 (FIG. 3) leaves a 29 between the features 36 and 38.

The features 32, 34, 36 and 38 have sidewalls (or, alternatively, sidewall surfaces) 33, 35, 37 and 39, respectively. The sidewalls 33 along the feature 32 are labeled as first and second sidewalls 33*a* and 33*b*, respectively, so that they may be distinguished from one another. Similarly, the sidewalls along the feature 34 are labeled as first and second sidewalls 35*a* and 35*b*; the sidewalls along the feature 36 are labeled as first and second sidewalls 37*a* and 37*b*; and the sidewalls along the feature 38 are labeled as first and second sidewalls 39*a* and 39*b*.

The features 32, 34, 36 and 38 have tops (or, alternatively, top surfaces) 41, 43, 45 and 47, respectively.

Figure 6:
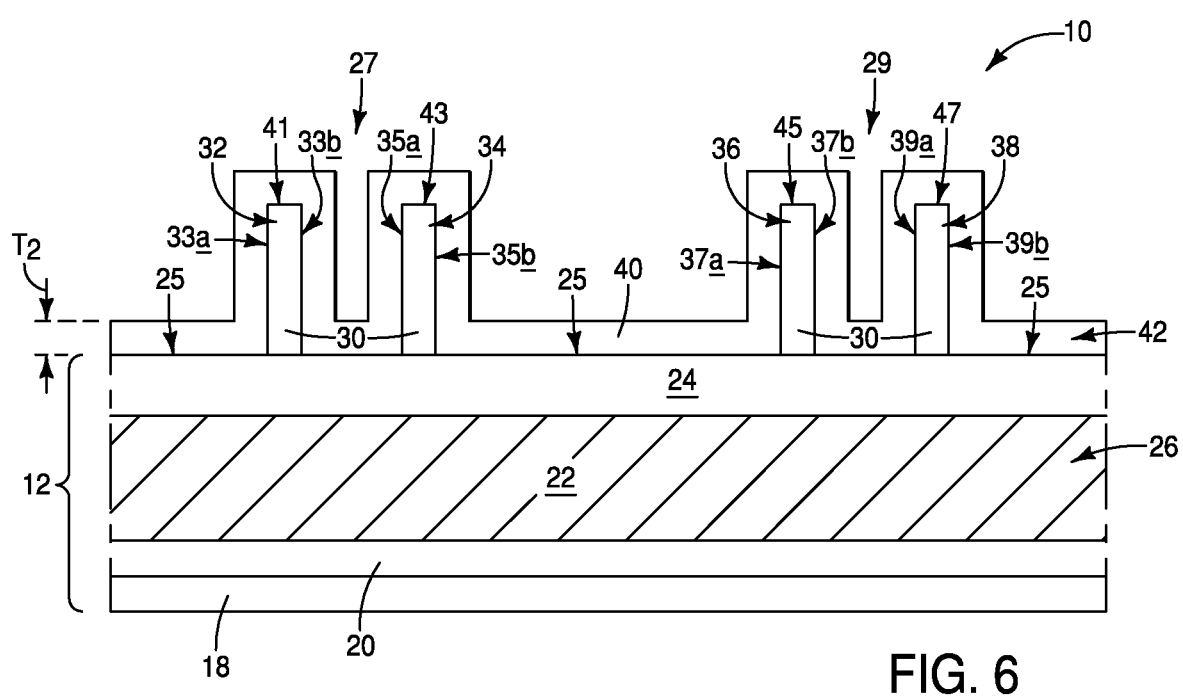
FIG. 6 is a diagrammatic cross-sectional side view of a region of the assembly of FIGS. 1 and 2 at a process stage subsequent to that of FIGS. 4 and 5.

Referring to FIG. 6, a layer 42 is formed to extend along the upper surface 25 of the substrate 12; along the top surfaces 41, 43, 45 and 47 of the features 32, 34, 36 and 38; and along the sidewalls 33, 35, 37 and 39 of the features 32, 34, 36 and 38. The layer 42 may be referred to as a second layer in some embodiments in order to distinguish it from other layers.

The layer 42 comprises a material 40. Such material may comprise any suitable composition(s); and in some embodiments may comprise, consist essentially of, or consist of silicon nitride. The material 40 may be referred to as a second material to distinguish it from other materials; and the composition of material 40 may be referred to as a second composition to distinguish it from other compositions. The material 40 has a different composition than the material 30 so that the material 30 may be selectively removed relative to the material 40 in a subsequent process stage (discussed below with reference to FIGS. 13 and 14).

The layer 42 may be formed to any suitable thickness $T_2$; and in some embodiments is formed to a thickness which is about one-twelfth of the initial pitch Pi (shown in FIGS. 1 and 2). Accordingly, in some embodiments the thickness $T_2$ of the layer 42 is substantially the same (or about the same) as the thickness $T_1$ of the layer 28 (FIG. 3); with the terms "substantially the same" and "about the same" meaning the same to within reasonable tolerances of fabrication and measurement.

Figure 7:
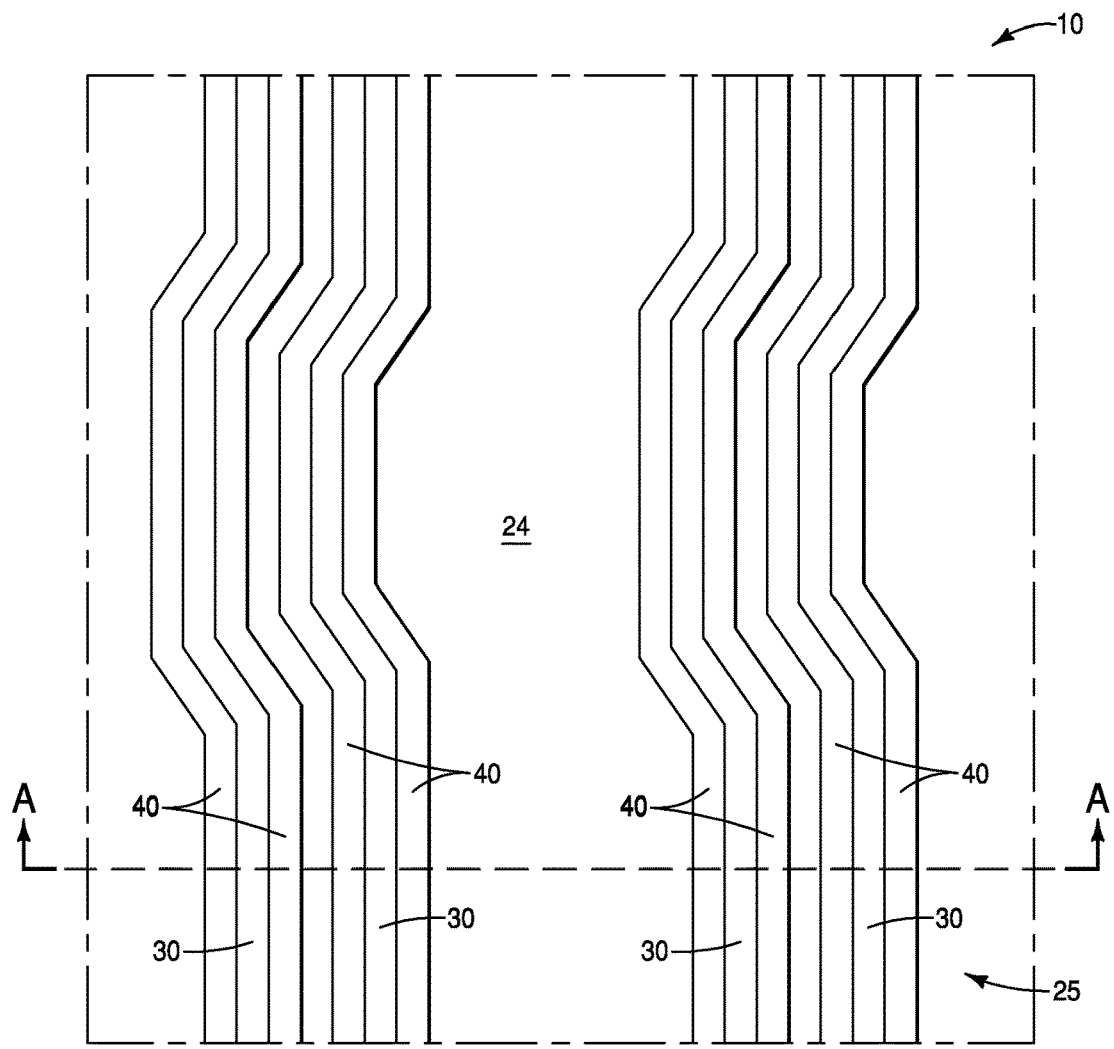
FIGS. 7 and 8 are a diagrammatic top view and a diagrammatic cross-sectional side view, respectively, of a region of the assembly of FIGS. 1 and 2 at a process stage subsequent to that of FIG. 6. The view of FIG. 8 is along the line A-A of FIG. 7.
Figure 8:
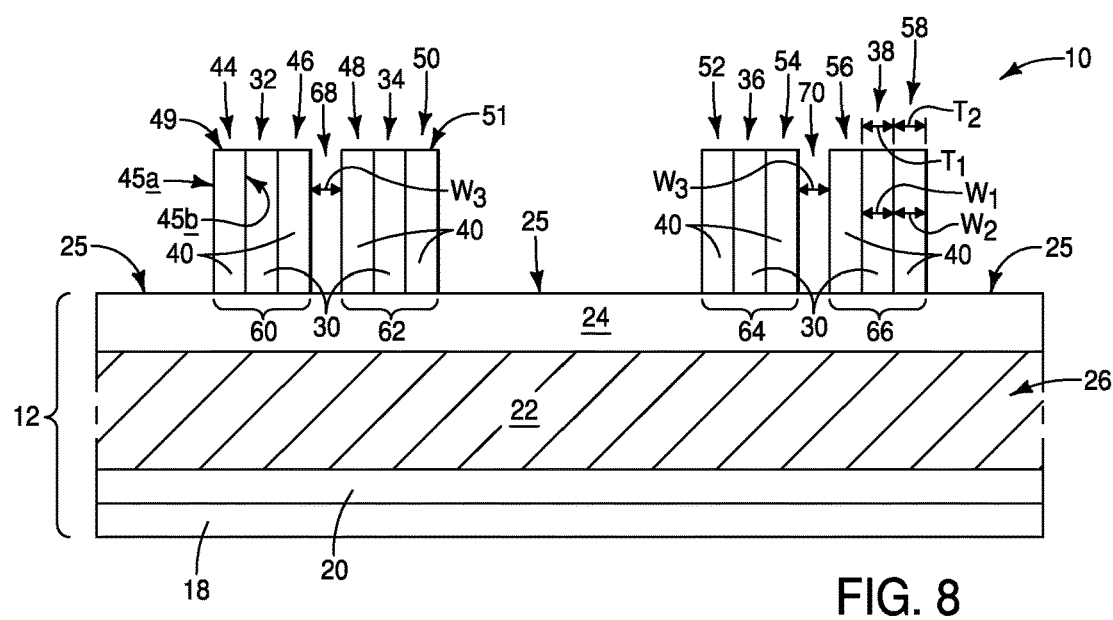

Referring to FIGS. 7 and 8, the layer 42 (FIG. 6) is anisotropically etched to form features 44, 46, 48, 50, 52, 54, 56 and 58 along the sidewalls of the features 32, 34, 36 and 38. The features 44, 46, 48, 50, 52, 54, 56 and 58 have sidewalls (or, alternatively, sidewall surfaces) analogous to those of the features 32, 34, 36 and 38 (discussed above with reference to FIG. 5). The sidewalls of the feature 44 are labeled as first and second sidewalls 45a and 45b, respectively. The sidewalls of the other features 46, 48, 50, 52, 54, 56 and 58 are not labeled in order to simplify the drawing.

The features 44, 46, 48, 50, 52, 54, 56 and 58 have tops (or, alternatively, top surfaces) analogous to those of the features 32, 34, 36 and 38 (discussed above with reference to FIG. 5). The top of the feature 50 is labeled as 51. The tops of the other features 44, 46, 48, 52, 54, 56 and 58 are not labeled in order to simplify the drawing.

In some embodiments, the features 32, 34, 36 and 38 may be referred to as first features; and the features 44, 46, 48, 50, 52, 54, 56 and 58 may be referred to as second features. Each of the first features (e.g., 32) is between a pair of the second features (e.g., 44 and 46). The first feature (e.g., 32) and the associated pair of second features (e.g., 44 and 46) may be considered together to form a triplet structure. In the shown embodiment, the features 32, 44 and 46 form a triplet structure 60; the features 34, 48 and 50 form a triplet structure 62; the features 36, 52 and 54 form a triplet structure 64; and the features 38, 56 and 58 formed a triplet structure 66. Each of the triplet structures comprises a pair of opposing sidewalls (with sidewall 45a being example of one of the opposing sidewalls of the triplet structure 60), and comprises a top surface (with the top surface of the triplet 60 being labeled 49).

In the shown embodiment, the features 32, 34, 36 and 38 comprise a horizontal width $W_1$ along the cross-section of FIG. 8 corresponding to the thickness $T_1$ described above with reference to FIG. 3; and the features 44, 46, 48, 50, 52, 54, 56 and 58 comprise a horizontal width $W_2$ along the cross-section of FIG. 8 corresponding to the thickness $T_2$ described above with reference to FIG. 6. The horizontal widths $W_1$ and $W_2$ may be referred to as first and second horizontal widths, respectively. In the shown embodiment, the first and second horizontal widths are about the same as one another.

The neighboring triplet structures 60 and 62 may be considered to be paired with one another, and to be spaced from one another by an intervening gap 68; and similarly the neighboring triplet structures 64 and 66 may be considered to be paired with one another, and to be spaced from one another by an intervening gap 70. In the shown embodiment, the intervening gaps 68 and 70 have horizontal widths $W_3$, with such horizontal widths being about the same as the horizontal widths $W_1$ and $W_2$.

Figure 9:
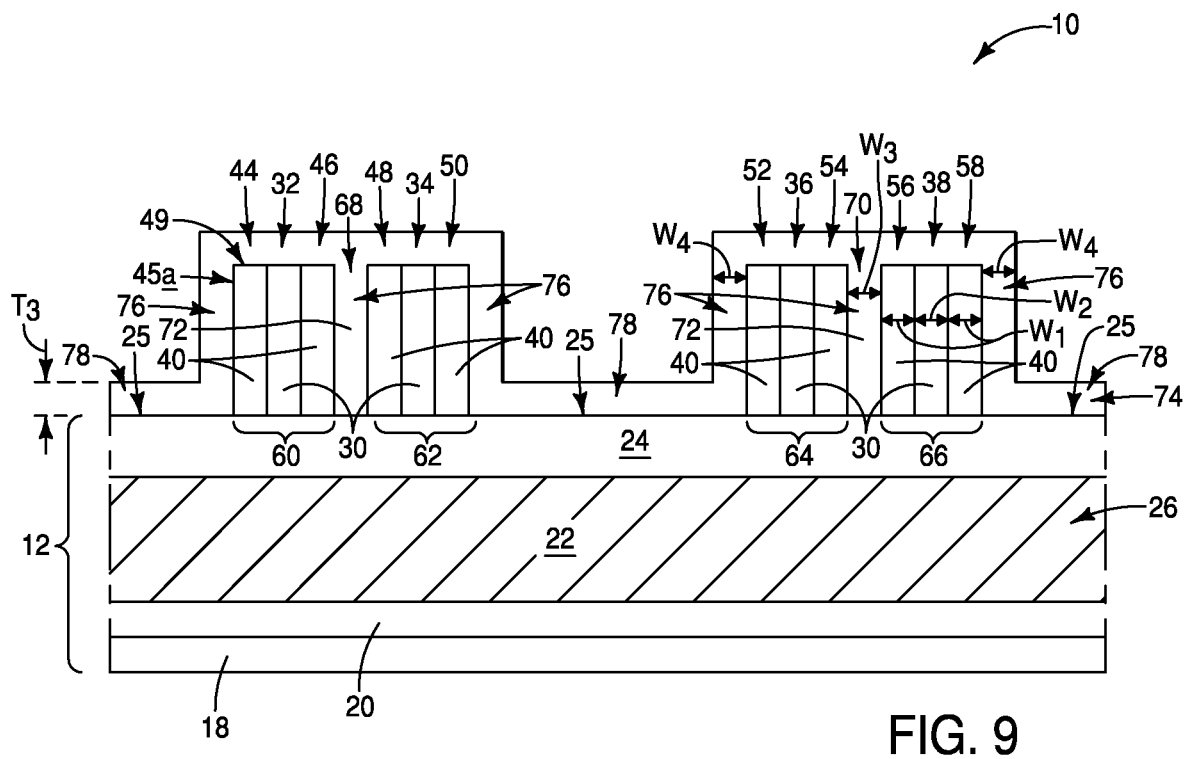
FIG. 9 is a diagrammatic cross-sectional side view of a region of the assembly of FIGS. 1 and 2 at a process stage subsequent to that of FIGS. 7 and 8.

Referring to FIG. 9, a layer 74 is formed to extend along the upper surface 25 of the substrate 12, over the first and second features 32, 34, 36, 38, 44, 46, 48, 50, 52, 54, 56 and 58; and along the sidewalls of the second features (e.g., the sidewall 45a). The layer 74 may be referred to as a third layer in some embodiments in order to distinguish it from other layers. In some embodiments, the layer 74 may be considered to extend over the top surfaces of the triplet structures (e.g., surface 49), and to extend along the sidewall surfaces of the triplet structures (e.g., surface 45a).

The layer 74 comprises a material 72. Such material may comprise any suitable composition(s); and in some embodiments may comprise, consist essentially of, or consist of silicon dioxide. The material 72 may be referred to as a third material to distinguish it from other materials; and the composition of material 72 may be referred to as a third composition to distinguish it from other compositions. The material 72 has a different composition than the material 40 so that the material 72 may be selectively removed relative to the material 40 in a subsequent process stage (discussed below with reference to FIGS. 13 and 14). In some embodiments, the material 72 may comprise a same composition as the material 30.

The layer 74 may be formed to any suitable thickness $T_3$; and in some embodiments is formed to a thickness which is about one-twelfth of the initial pitch Pi (shown in FIGS. 1 and 2). Accordingly, in some embodiments the thickness $T_3$ of the layer 74 is substantially the same (or about the same) as the thicknesses $T_1$ and $T_2$ of the layers 28 (FIG. 3) and 42 (FIG. 6).

The third layer 74 comprises vertically-extending segments 76 along sidewalls of the second features 44, 46, 48, 50, 52, 54, 56 and 58; with two of the vertically-extending segments 76 being within the gaps 68 and 70. The third layer 74 also comprises horizontally-extending segments 78 which extend outwardly from some of the vertically-extending segments 76, and which are along the upper surface 25 of the substrate 12.

In the illustrated embodiment of FIG. 9, the vertically-extending segments 76 have a horizontal width $W_4$ which is about the same as the horizontal widths $W_1$ and $W_2$ of the first and second features 32, 34, 36, 38, 44, 46, 48, 50, 52, 54, 56 and 58.

Figure 10:
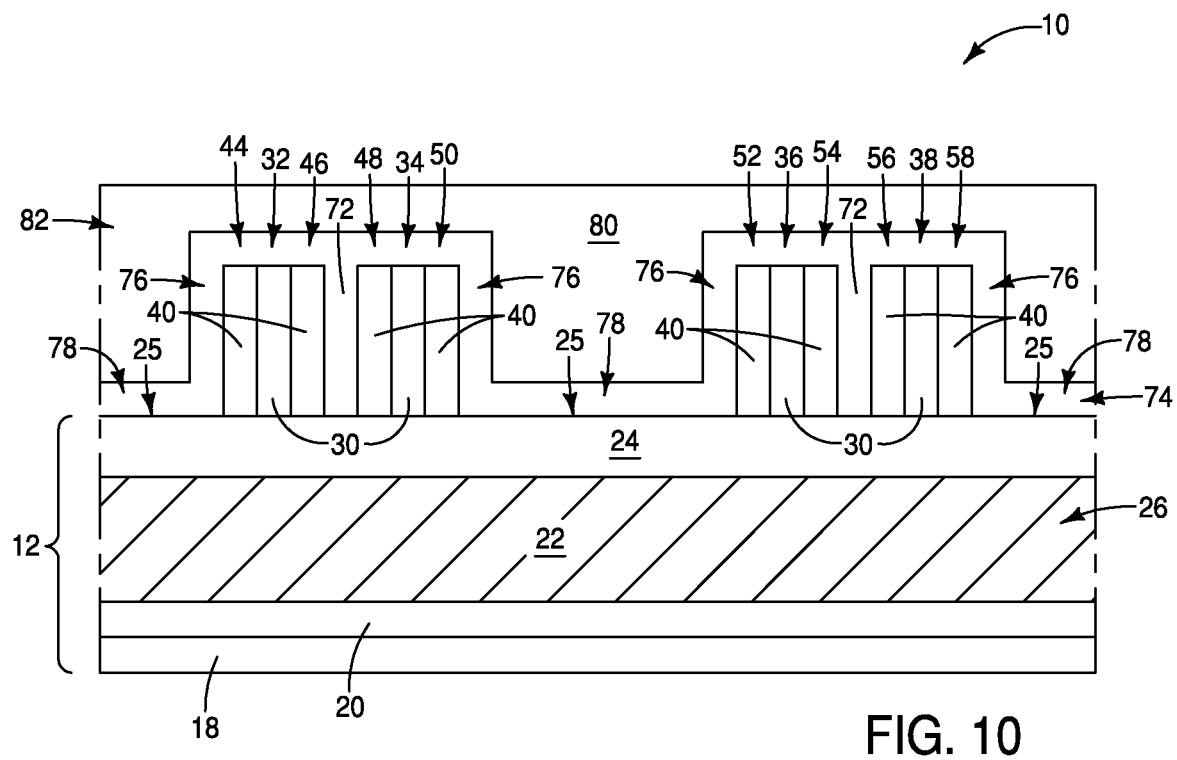
FIG. 10 is a diagrammatic cross-sectional side view of a region of the assembly of FIGS. 1 and 2 at a process stage subsequent to that of FIG. 9.

Referring to FIG. 10, polymeric material 80 is formed over the third layer 74. The polymeric material 80 may be a flowable material, and may be formed across the third layer 74 utilizing spin-coating methodology. In some embodiments, the material 80 may be referred to as an underlayer (UL) coating. The material 80 may be considered to form a fourth layer 82 which is over the third layer 74.

The material 80 may comprise any suitable composition(s); and in some embodiments may comprise organic material. For instance, the material 80 may primarily comprise carbon and hydrogen (i.e., may comprise more than 50 atomic percent carbon and hydrogen). In some embodiments, the material 80 may comprise organic material corresponding to a photoresist (e.g., organic polymeric material which includes photo-sensitive acid generator, and which includes one or more of acrylate, methacrylate, styrene, phenol, phenyl, diol, and/or other suitable cross-linking functional groups); or corresponding to an antireflective material (e.g., organic polymeric material comprising one or more chromophores or other suitable light-absorbing moieties), with example antireflective materials including BARC.

Figure 11:
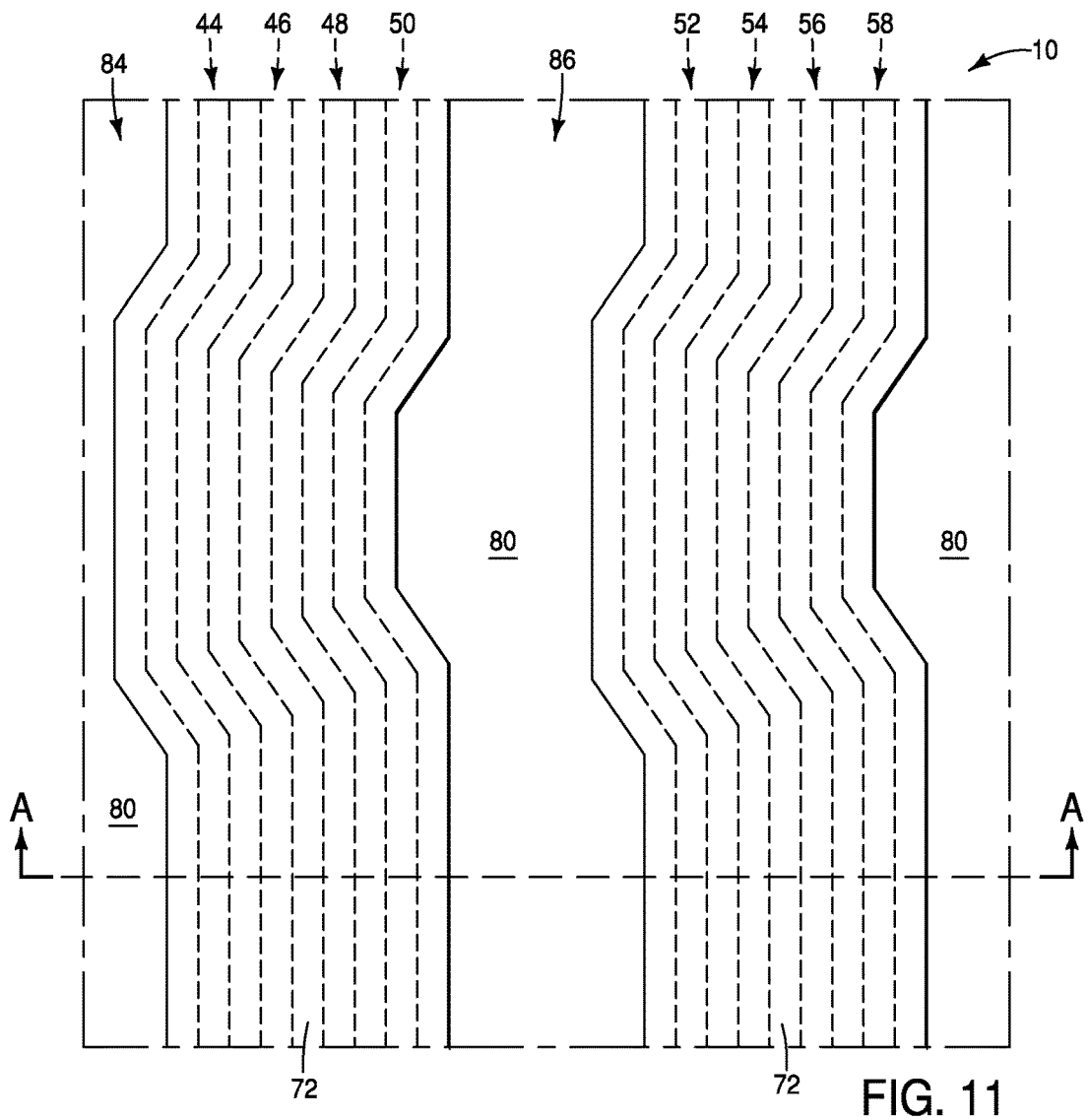
FIGS. 11 and 12 are a diagrammatic top view and a diagrammatic cross-sectional side view, respectively, of a region of the assembly of FIGS. 1 and 2 at a process stage subsequent to that of FIG. 10. The view of FIG. 12 is along the line A-A of FIG. 11.
Figure 12:
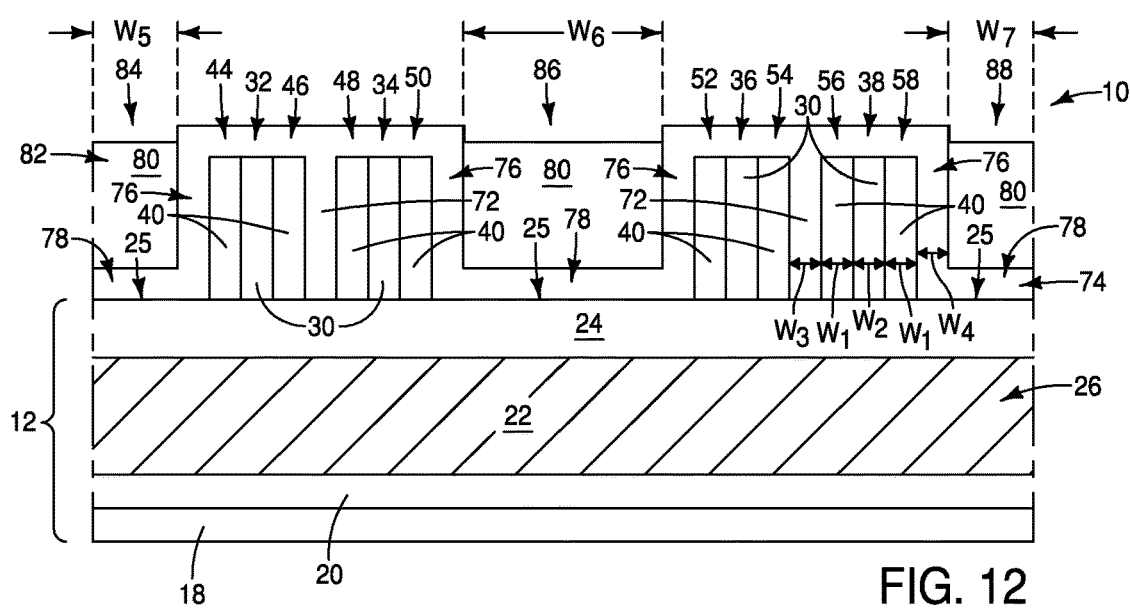

Referring to FIGS. 11 and 12, the polymeric material 80 is subjected to appropriate processing (e.g., etching, chemical-mechanical polishing, etc.) to remove the material from over the first and second features 32, 34, 36, 38, 44, 46, 48, 50, 52, 54, 56 and 58. In the shown embodiment, a portion of the third layer 74 remains over the first and second features 32, 34, 36, 38, 44, 46, 48, 50, 52, 54, 56 and 58; but it is to be understood that in other embodiments the third layer may be removed from over the first and second features with the processing utilized to reduce the thickness of the fourth layer 82. In the illustrated embodiment of FIG. 11, the features 44, 46, 48, 50, 52, 54, 56 and 58 are illustrated in dashed-line (i.e., phantom) view to indicate that such features are beneath the third material 72 relative to the top view of FIG. 11.

The remaining portions of the polymeric material 80 at the processing stage of FIG. 12 are over the horizontally-extending segments 78 of the third material 74. In some embodiments, regions of the polymeric material 80, together with horizontally-extending segments 78 under such regions, may be considered to form blocks 84, 86 and 88. In the shown embodiment, the blocks 84, 86 and 88 comprise horizontal widths $W_5$, $W_6$ and $W_7$, respectively; and such horizontal widths are at least about double the dimensions of the horizontal widths $W_1$, $W_2$, $W_3$ and $W_4$ along the cross-section of FIG. 12.

Figure 13:
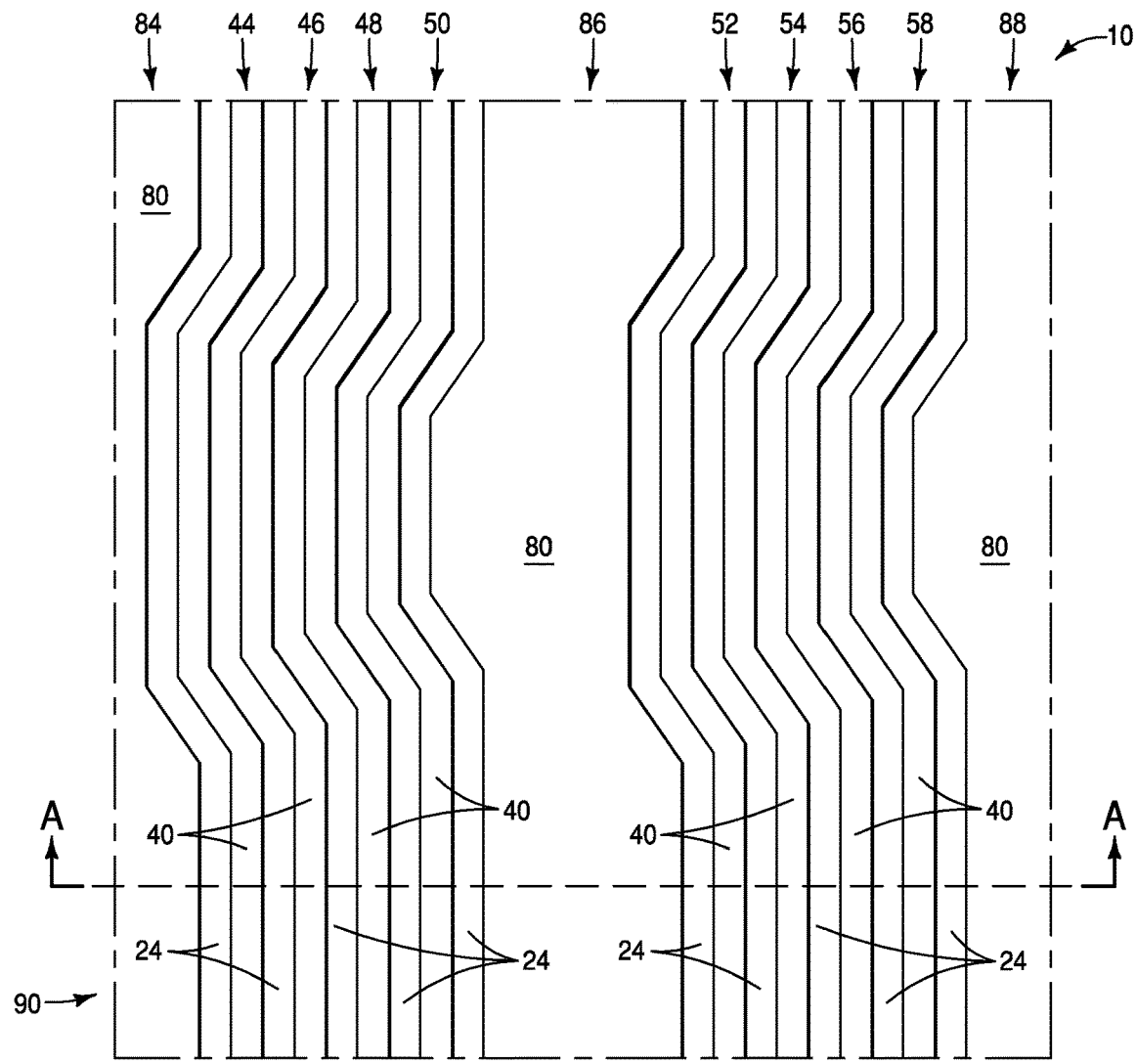
FIGS. 13 and 14 are a diagrammatic top view and a diagrammatic cross-sectional side view, respectively, of a region of the assembly of FIGS. 1 and 2 at a process stage subsequent to that of FIGS. 11 and 12. The view of FIG. 14 is along the line A-A of FIG. 13.
Figure 14:
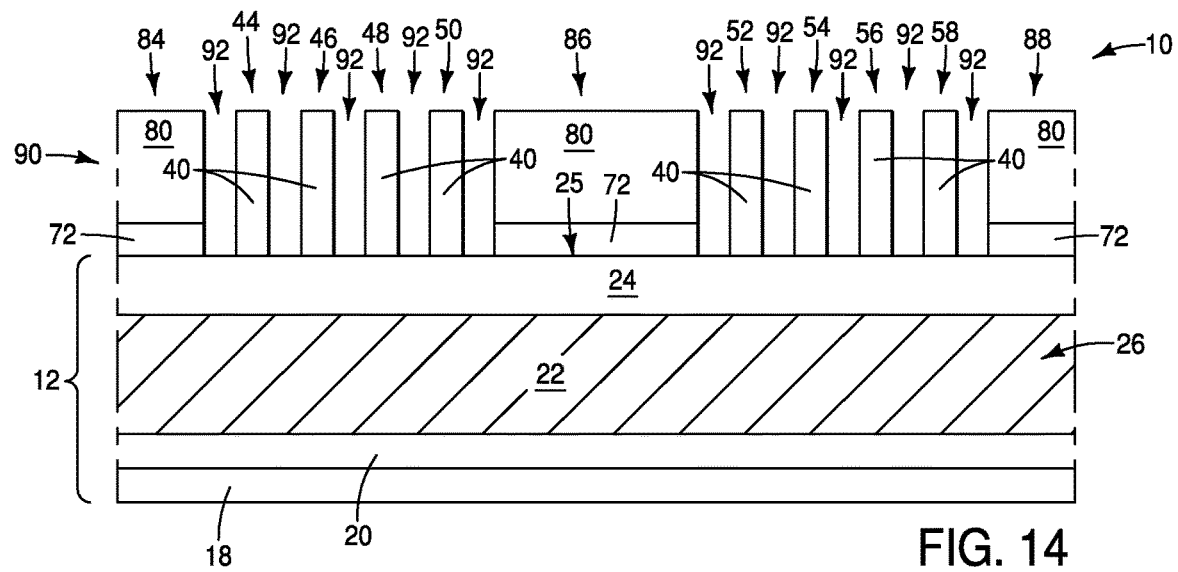

Referring to FIGS. 13 and 14, the materials 72 and 30 (FIGS. 11 and 12) are selectively removed relative to the materials 40 and 80 with an appropriate etch. In some embodiments, the materials 30 and 72 both comprise silicon dioxide, the material 40 comprises silicon nitride, and the material 80 comprises organic material. In such embodiments, the materials 30 and 72 may be selectively removed with an etch comprising hydrofluoric acid. The term "selective removal" means that one composition is removed faster than another; and may include, but is not limited to, embodiments in which an etch is 100% selective for one material relative to another.

The features and blocks 44, 46, 48, 50, 52, 54, 56, 58, 84, 86 and 88 of FIGS. 13 and 14 form a pattern 90 extending across the substrate 12. Such pattern may be considered to include gaps 92 exposing the upper surface 25 of the substrate 12.

Figure 15:
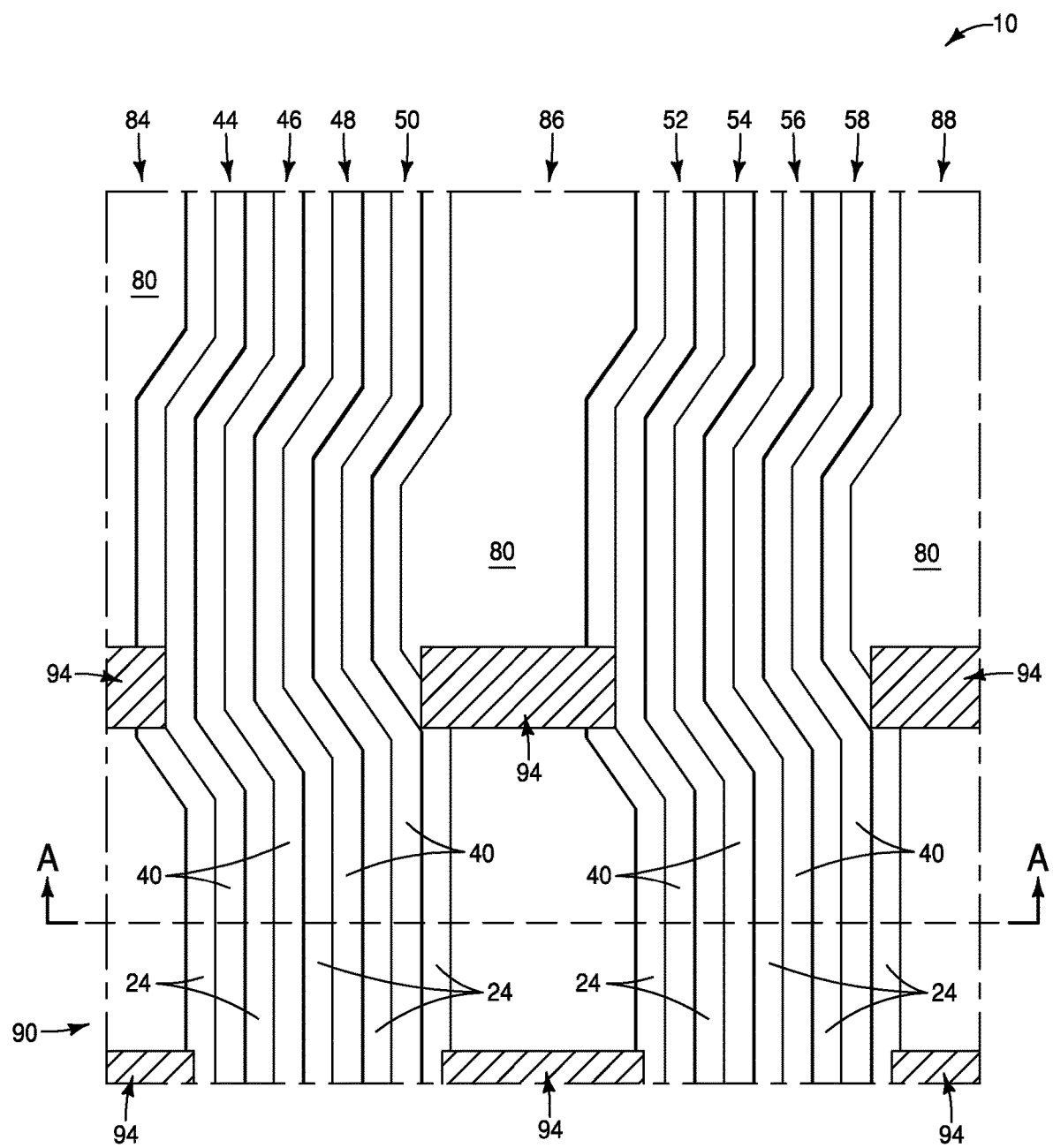
FIG. 15 is a diagrammatic top view of a region of the assembly of FIGS. 1 and 2 at a process stage subsequent to that of FIGS. 13 and 14.

Referring to FIG. 15, locations 94 are identified where the material 80 will be "chopped" to further pattern such material.

Figure 16:
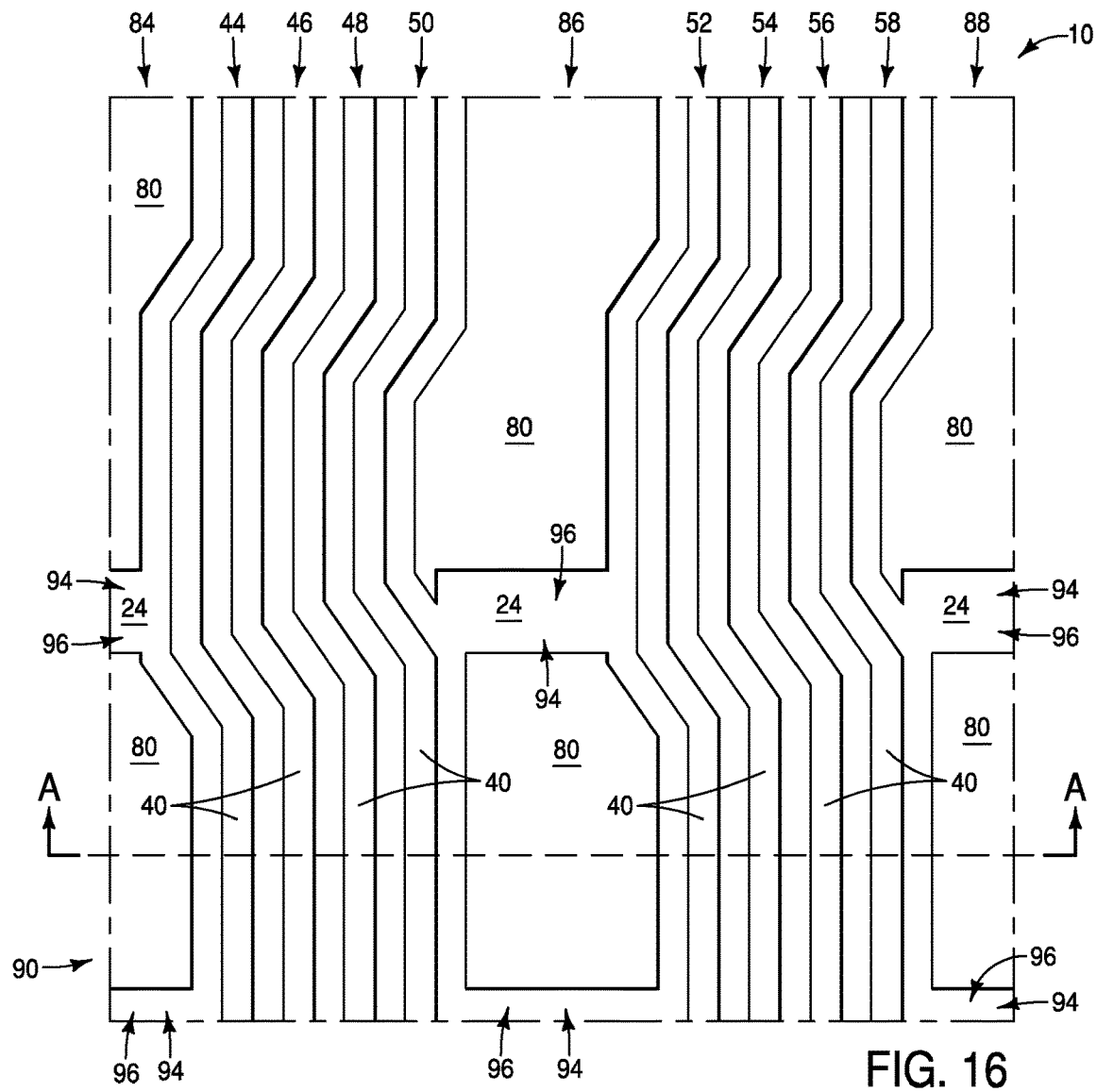
FIGS. 16 and 17 are a diagrammatic top view and a diagrammatic cross-sectional side view, respectively, of a region of the assembly of FIGS. 1 and 2 at a process stage subsequent to that of FIG. 15. The view of FIG. 17 is along the line A-A of FIG. 16.
Figure 17:
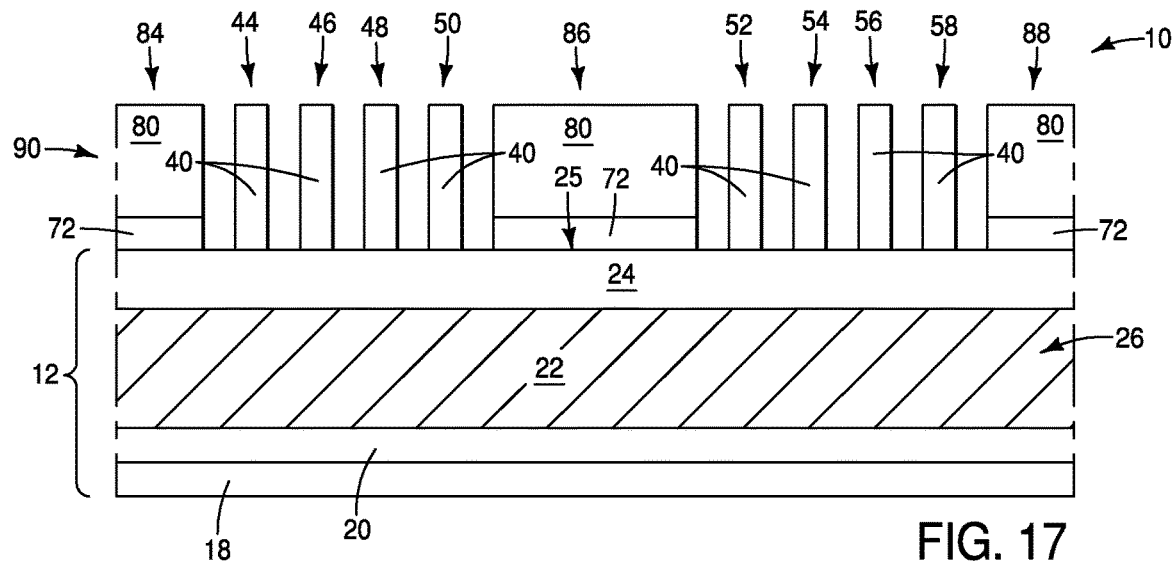

Referring to FIGS. 16 and 17, openings 96 are formed at the locations 94. Such openings may be formed with appropriate masking and etching. The formation of the openings 96 further patterns the mask 90.

Figure 18:
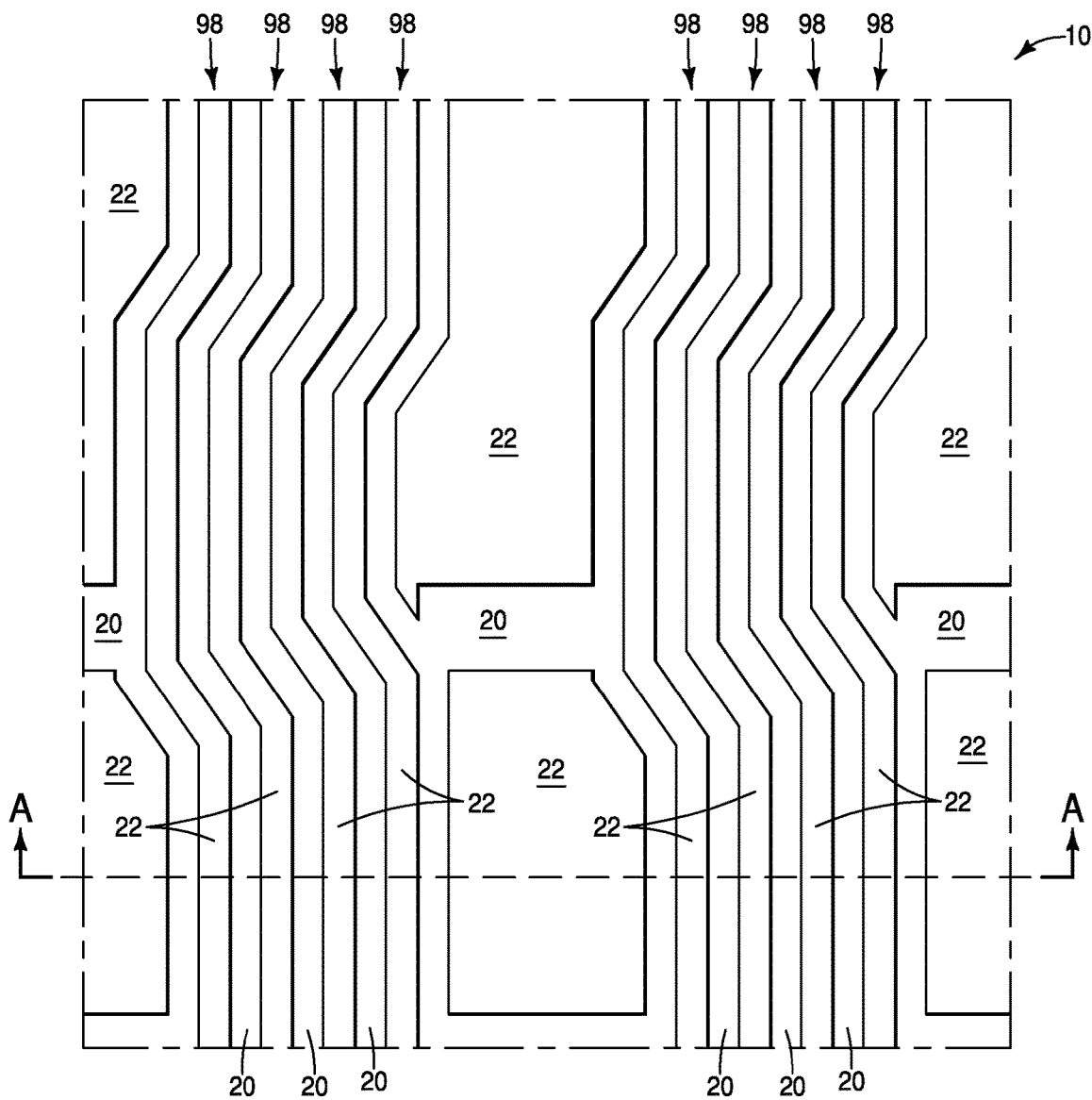
FIGS. 18 and 19 are a diagrammatic top view and a diagrammatic cross-sectional side view, respectively, of a region of the assembly of FIGS. 1 and 2 at a process stage subsequent to that of FIGS. 16 and 17. The view of FIG. 19 is along the line A-A of FIG. 18.
Figure 19:
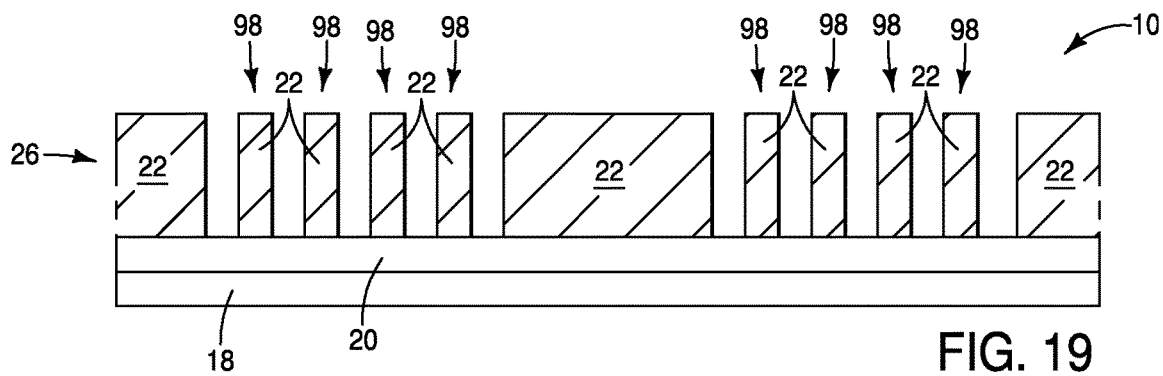

Referring to FIGS. 18 and 19, the pattern of the mask 90 (FIGS. 16 and 17) is transferred into the expanse 26 of conductive material 22 to thereby form wiring structures 98 from the conductive material. In other embodiments, other components may be fabricated from the conductive material in addition to, or alternatively to, the wiring structures. Further, in other embodiments other materials (e.g., semiconductor materials, insulative materials, etc.) may be patterned alternatively to, or in addition to, the conductive material 22.

The transfer of the pattern of mask 90 (FIGS. 16 and 17) into the conductive material 22 may be accomplished with any suitable etch or combination of etches. For instance, a first etch may be utilized to transfer the pattern into a hard masking composition of material 24 (FIG. 17), and then a second etch may be utilized to transfer the pattern from the hard-mask into the conductive material 22. Subsequently, the material 24 (FIG. 17) may be removed (as shown), or alternatively at least some of the material 24 (FIG. 17) may remain over the wiring structures patterned from the conductive material 22.

FIGS. 1-19 illustrate an example method in which multiple photoresist features (e.g., the features 14 and 16 of FIGS. 1 and 2) are utilized to pattern a masking material (e.g., the material 40 of FIGS. 16 and 17). In some embodiments, the invention may include patterning relative to one or more sacrificial features (e.g., one or more of the features 32, 34, 36 and 38 of FIGS. 4 and 5), regardless of how such features are fabricated (i.e., regardless of whether such features are fabricated utilizing the patterned photoresist of FIGS. 1 and 2, or are fabricated with other methodology). An example method is described with reference to FIGS. 20-27.

Figure 20:
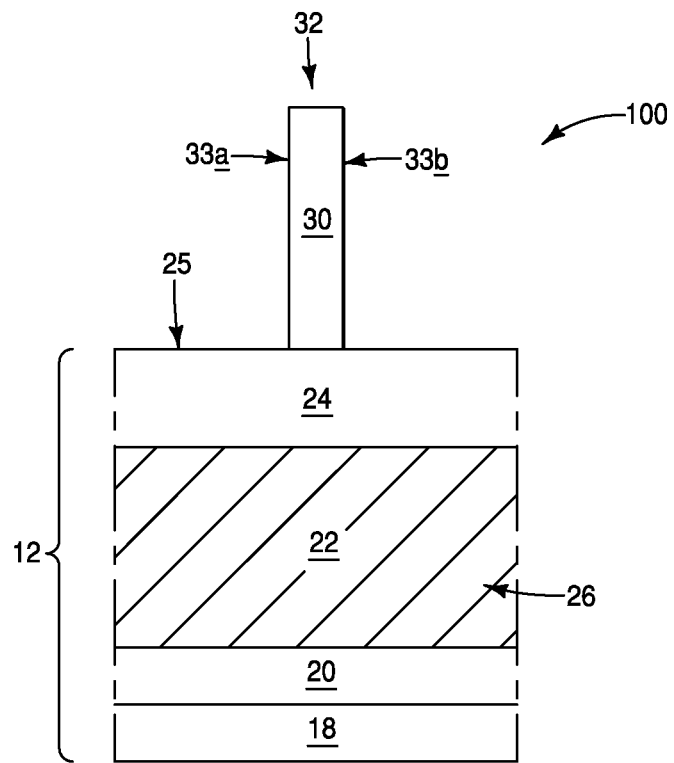
FIGS. 20-27 are diagrammatic cross-sectional side views of a region of an assembly at example process stages of an example method for forming an example pattern.

Referring to FIG. 20, a region of an assembly 100 is illustrated. Such assembly comprises the sacrificial feature 32 (i.e., a first feature) supported by the substrate 12; and may correspond to a processing stage analogous to that described above with reference to FIG. 5. However, the feature 32 may be formed with any suitable processing; including, but not limited to, the processing described above with reference to FIGS. 1-5.

Figure 21:
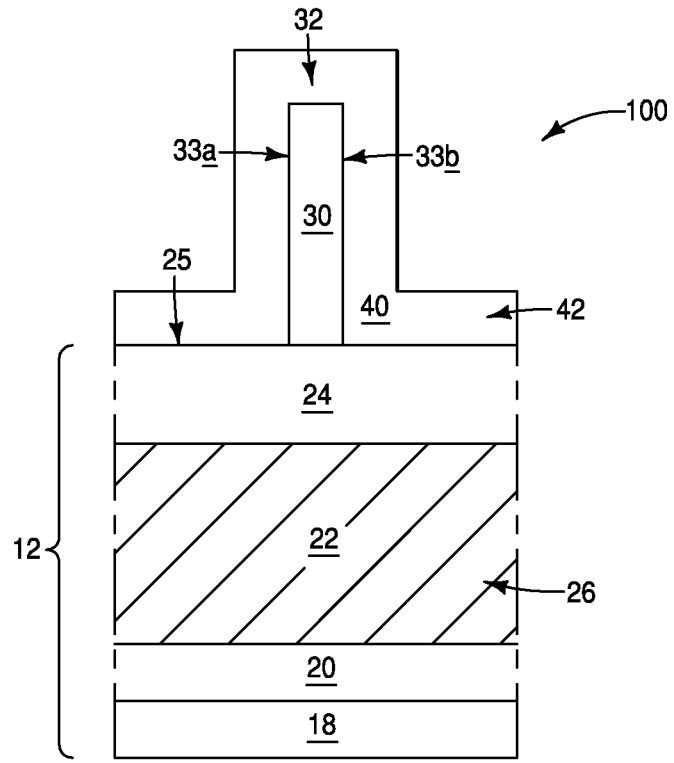

Referring to FIG. 21, the layer 42 is formed over the first feature 32 and along the opposing sidewalls 33a and 33b of such feature.

Figure 22:
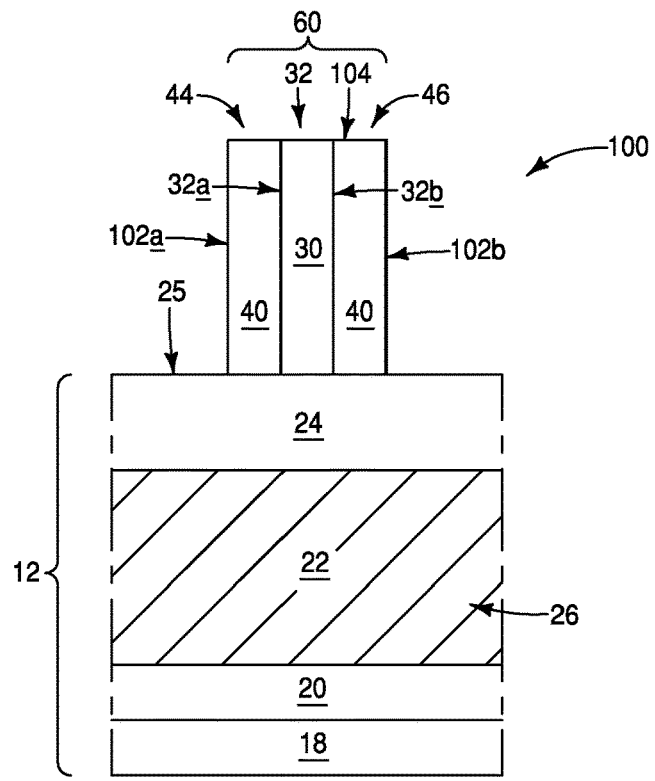

Referring to FIG. 22, the layer 42 (FIG. 21) is patterned into the pair of second features 44 and 46. The feature 44 is along the first sidewall 32a, and may be considered to be a first of the second features; and the feature 46 is along the second sidewall 32b, and may be considered to be a second of the second features.

The features 32, 44 and 46 together form the triplet structure 60. Such triplet structure comprises a pair of opposing sidewalls 102a and 102b along the cross-section of FIG. 22, and comprises a top surface 104 having exposed regions of the features 32, 44 and 46.

The processing stage of FIG. 22 is analogous to that described above with reference to FIGS. 7 and 8.

Figure 23:
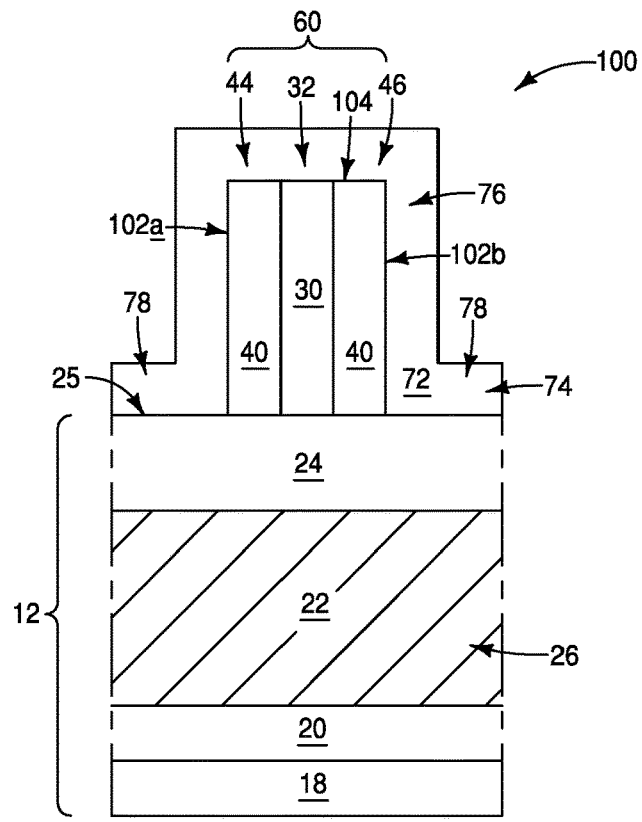

Referring to FIG. 23, the layer 74 is formed to extend across the upper surface 104 of the triplet structure 60, and along the opposing sidewalls 102a and 102b of the triplet structure. The layer 74 comprises the vertically-extending segments 76, and the horizontally-extending segments 78. The processing stage of FIG. 23 is analogous to that described above with reference to FIG. 9.

Figure 24:
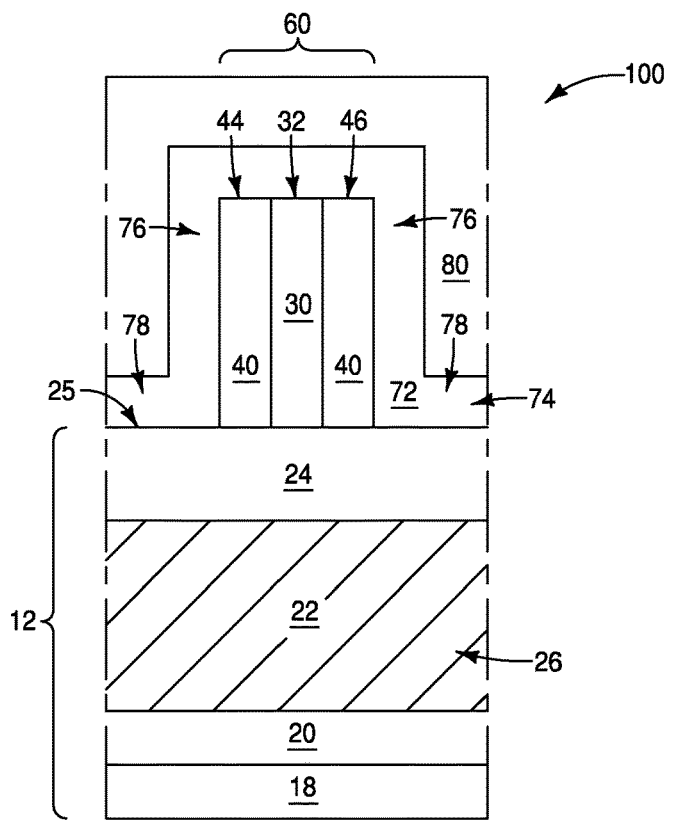

Referring to FIG. 24, the polymeric material 80 is formed over the layer 74 at a processing stage analogous to that described above with reference to FIG. 10.

Figure 25:
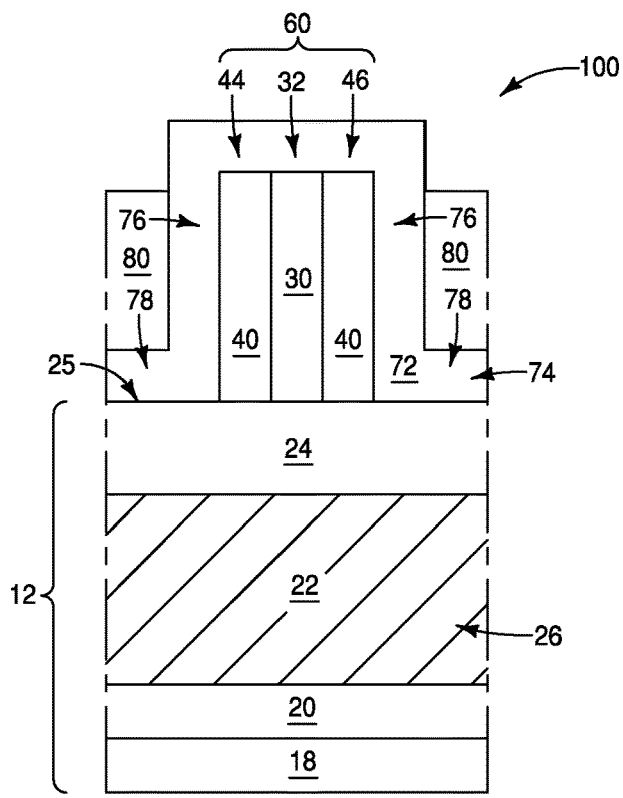

Referring to FIG. 25, the polymeric material 80 is subjected to appropriate processing (e.g., processing described above with reference to FIGS. 11 and 12) to remove the material from over the triplet structure 60.

Figure 26:
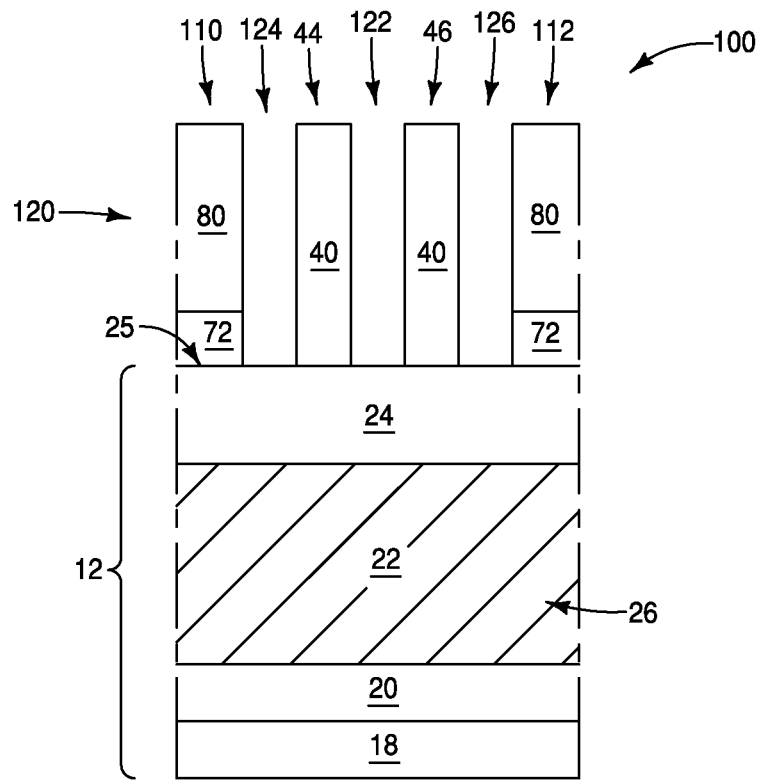

Referring to FIG. 26, material 30 (FIG. 25) and the vertically-extending segments 76 of material 72 (FIG. 26) are removed with processing analogous to that described above with reference to FIGS. 13 and 14. In some embodiments, the removal of the material 30 may be considered to remove the first feature 32 (FIG. 25).

The stacked materials 80 and 72 together form first and second blocks 110 and 112 analogous to the blocks 84, 86 and 88 shown in FIG. 14.

The features 44 and 46, together with the blocks 110 and 112, form a pattern 120 over the substrate 12. Such pattern includes a first gap 122 between the features 44 and 46, a second 124 between the first block 110 and the feature 44, and a third gap 126 between the feature 46 and the second block 112.

Figure 27:
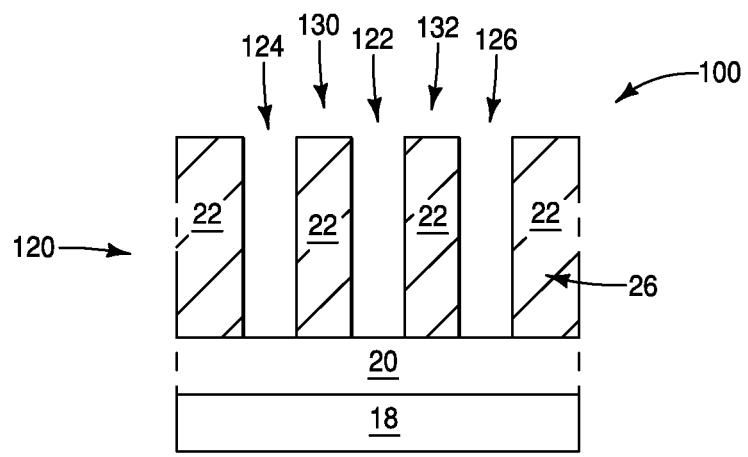

Referring to FIG. 27, the pattern 120 is transferred into the expanse 26 of conductive material 22 to form wiring structures 130 and 132 from the conductive material. Such transfer of the pattern into the conductive material may be accomplished with processing analogous to that described above with reference to FIGS. 18 and 19.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming an assembly. A first feature is formed over a substrate. The first feature includes a first material. The first feature includes a pair of opposing sidewalls along a cross-section. The opposing sidewalls of the first feature are a first sidewall and a second sidewall. A pair of second features is formed. The pair includes a first of the second features and a second of the second features. The first of the second features is along the first sidewall, and the second of the second features is along the second sidewall. The second features include a second material which is compositionally different than the first material. The second features and the first feature together form a triplet structure. The triplet structure includes a pair of opposing sidewalls along the cross-section, and includes an upper surface having exposed regions of the first and second features. A layer of a third material is formed to extend along the opposing sidewalls of the triplet structure, across the upper surface of the triplet structure, and along an upper surface of the substrate adjacent the triplet structure. Vertically-extending segments of the third material are along the opposing sidewalls of the triplet structure. Horizontally-extending segments of the third material extend outwardly from the vertically-extending segments and are along the surface of the substrate adjacent the triplet structure. Polymeric material is formed over the layer of the third material. The polymeric material is removed from over the triplet structure. Regions of the polymeric material remain over the horizontally-extending segments of the third material. The regions of the polymeric material and the horizontally-extending segments of the third material together form blocks adjacent the vertically-extending segments of the third material. The first feature and the vertically-extending segments of the third material are removed to leave a pattern over the substrate. The pattern includes the second features and the blocks, includes a first gap between the second features, includes a second gap between the first of the second features and one of the blocks, and includes a third gap between the second of the second features and another of the blocks.

Some embodiments include a method of forming an assembly. A photoresist feature is formed over a substrate. The photoresist feature has a top surface and a pair of sidewall surfaces along a cross-section. A first layer is formed to extend along the substrate, along the top surface of the photoresist feature, and along the sidewall surfaces of the photoresist feature. The first layer includes silicon dioxide. The first layer is anisotropically etched to form first features along the sidewall surfaces of the photoresist feature. The first features have sidewall surfaces. The photoresist feature is removed to leave a gap between the first features. A second layer is formed to extend along the substrate, over the first features, and along the sidewall surfaces of the first features. The second layer comprises silicon nitride. The second layer is anisotropically etched to form second features along the sidewall surfaces of the first features. The second features have sidewall surfaces. A third layer is formed to extend along the substrate, over the first and second features, and along the sidewall surfaces of the second features. The third layer comprises silicon dioxide. A fourth layer is spin-coated over the third layer. A portion of the fourth layer is removed from over the first and second features. Vertically-extending segments of the third layer remain along the sidewall surfaces of the second features after the portion of the fourth layer is removed. Horizontally-extending segments of the third layer extend outwardly from the vertically-extending segments of the third layer. Regions of the fourth layer remain over the horizontally-extending segments of the third layer. The regions of the fourth layer and the horizontally-extending segments of the third layer together form blocks. The first features and the vertically-extending segments of the third layer are removed to leave a pattern over the substrate. The pattern comprises the second features and the blocks.

Some embodiments include a method of forming an assembly. A pair of photoresist features is formed over a substrate. The photoresist features of said pair each have top surfaces and sidewall surfaces along a cross-section. A first layer is formed to extend along the substrate, along the top surfaces of the photoresist features, and along the sidewall surfaces of the photoresist features. The first layer comprises a first composition. The first layer is anisotropically etched to form first features along the sidewall surfaces of the photoresist features. The first features have sidewall surfaces. The photoresist features are removed to leave gaps between the first features. A second layer is formed to extend along the substrate, over the first features, and along the sidewall surfaces of the first features. The second layer comprises a second composition which is different from the first composition. The second layer is anisotropically etched to form second features along the sidewall surfaces of the first features. The second features have sidewall surfaces, A third layer is formed to extend along the substrate, over the first and second features, and along the sidewall surfaces of the second features. The third layer comprises the first composition. Polymeric material is formed over the third layer. A portion of the polymeric material is removed from over the first and second features. Vertically-extending segments of the third layer remain along the sidewall surfaces of the second features after the portion of the polymeric material is removed. Horizontally-extending segments of the third layer extend outwardly from the vertically-extending segments of the third layer. Regions of the polymeric material remain over the horizontally-extending segments of the third layer. The regions of the polymeric material and the horizontally-extending segments of the third layer together form blocks adjacent the vertically-extending segments of the third layer. The first features and the vertically-extending segments of the third layer are removed to leave a pattern over the substrate. The pattern comprises the second features and the blocks.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming an assembly, comprising:
   forming a first feature over a substrate; the first feature comprising a first material; the first feature comprising a pair of opposing sidewalls along a cross-section; the opposing sidewalls of the first feature being a first sidewall and a second sidewall;
   forming a pair of second features, said pair being a first of the second features and a second of the second features; the first of the second features being along the first sidewall, and the second of the second features being along the second sidewall; the second features comprising a second material which is compositionally different than the first material; the second features and the first feature together forming a triplet structure; the triplet structure comprising a pair of opposing sidewalls along the cross-section, and comprising an upper surface having exposed regions of the first and second features;
   forming a layer of a third material to extend along the opposing sidewalls of the triplet structure, across the upper surface of the triplet structure, and along an upper surface of the substrate adjacent the triplet structure; vertically-extending segments of the third material being along the opposing sidewalls of the triplet structure; horizontally-extending segments of the third material extending outwardly from the vertically-extending segments and being along the surface of the substrate adjacent the triplet structure;
   forming polymeric material over the layer of the third material;
   removing the polymeric material from over the triplet structure; wherein the regions of the polymeric material remain over the horizontally-extending segments of the third material; wherein the regions of the polymeric material and the horizontally-extending segments of the third material together form blocks adjacent the vertically-extending segments of the third material; and
   removing the first feature and the vertically-extending segments of the third material to leave a pattern over the substrate; the pattern comprising the second features and the blocks, comprising a first gap between the second features, comprising a second gap between the first of the second features and one of the blocks, and comprising a third gap between the second of the second features and another of the blocks.

2. The method of claim 1 wherein the substrate includes an expanse of a conductive material; and further comprising transferring the pattern into said expanse of the conductive material to form wiring structures from the expanse of the conductive material.

3. The method of claim 1 wherein the first and third materials are a same composition as one another.

4. The method of claim 3 wherein the first and third materials comprise silicon dioxide.

5. The method of claim 4 wherein the second material comprises silicon nitride.

6. The method of claim 1 wherein the polymeric material primarily comprises carbon and hydrogen.

7. The method of claim 1 wherein the first features, the second features, and the vertically-extending segments are all of about a same horizontal width as one another along the cross-section.

8. The method of claim 7 wherein said same horizontal width is a first horizontal width; wherein the blocks have a second horizontal width along the cross-section; and wherein the second horizontal width is at least about double the first horizontal width.

9. The method of claim 7 wherein the triplet structure is one of a pair of adjacent triplet structures formed along the cross-section; with said adjacent triplet structures being spaced from one another by an intervening gap having about said same horizontal width.

10. A method of forming an assembly, comprising:
    forming a photoresist feature over a substrate; the photoresist feature having a top surface and a pair of sidewall surfaces along a cross-section;
    forming a first layer to extend along the substrate, along the top surface of the photoresist feature, and along the sidewall surfaces of the photoresist feature; the first layer comprising silicon dioxide;
    anisotropically etching the first layer to form first features along the sidewall surfaces of the photoresist feature; the first features having sidewall surfaces;
    removing the photoresist feature to leave a gap between the first features;
    forming a second layer to extend along the substrate, over the first features, and along the sidewall surfaces of the first features; the second layer comprising silicon nitride;
    anisotropically etching the second layer to form second features along the sidewall surfaces of the first features; the second features having sidewall surfaces;
    forming a third layer to extend along the substrate, over the first and second features, and along the sidewall surfaces of the second features; the third layer comprising silicon dioxide;
    spin-coating a fourth layer over the third layer;
    removing a portion of the fourth layer from over the first and second features;
    wherein vertically-extending segments of the third layer remain along the sidewall surfaces of the second features after the portion of the fourth layer is removed; wherein horizontally-extending segments of the third layer extend outwardly from the vertically-extending segments of the third layer; wherein regions of the fourth layer remain over the horizontally-extending segments of the third layer; wherein the regions of the fourth layer and the horizontally-extending segments of the third layer together form blocks; and removing the first features and the vertically-extending segments of the third layer to leave a pattern over the substrate; the pattern comprising the second features and the blocks.

11. The method of claim 10 wherein the fourth layer comprises an organic material.

12. The method of claim 11 wherein the fourth layer comprises a photoresist.

13. The method of claim 11 wherein the fourth layer comprises an antireflective material.

14. The method of claim 10 wherein the substrate includes an expanse of a conductive material; and further comprising transferring the pattern into said expanse of the conductive material to form wiring structures from the expanse of the conductive material.

15. The method of claim 10 wherein the first features, the second features, and the vertically-extending segments are all of about a same horizontal width as one another along the cross-section.

16. The method of claim 15 wherein said same horizontal width is a first horizontal width; wherein the blocks have a second horizontal width along the cross-section; and wherein the second horizontal width is at least about double the first horizontal width.

17. A method of forming an assembly, comprising:
forming a pair of photoresist features over a substrate; the photoresist features of said pair each having top surfaces and sidewall surfaces along a cross-section;
forming a first layer to extend along the substrate, along the top surfaces of the photoresist features, and along the sidewall surfaces of the photoresist features; the first layer comprising a first composition;
anisotropically etching the first layer to form first features along the sidewall surfaces of the photoresist features; the first features having sidewall surfaces;
removing the photoresist features to leave gaps between the first features;
forming a second layer to extend along the substrate, over the first features, and along the sidewall surfaces of the first features; the second layer comprising a second composition which is different from the first composition;
anisotropically etching the second layer to form second features along the sidewall surfaces of the first features; the second features having sidewall surfaces;
forming a third layer to extend along the substrate, over the first and second features, and along the sidewall surfaces of the second features; the third layer comprising the first composition;
forming polymeric material over the third layer;
removing a portion of the polymeric material from over the first and second features; wherein vertically-extending segments of the third layer remain along the sidewall surfaces of the second features after the portion of the polymeric material is removed; wherein horizontally-extending segments of the third layer extend outwardly from the vertically-extending segments of the third layer; wherein regions of the polymeric material remain over the horizontally-extending segments of the third layer; wherein the regions of the polymeric material and the horizontally-extending segments of the third layer together form blocks adjacent the vertically-extending segments of the third layer; and
removing the first features and the vertically-extending segments of the third layer to leave a pattern over the substrate; the pattern comprising the second features and the blocks.

18. The method of claim 17 wherein the substrate includes an expanse of a conductive material; and further comprising transferring the pattern into said expanse of the conductive material to form wiring structures from the expanse of the conductive material.

19. The method of claim 17 wherein the first composition comprises silicon dioxide, and wherein the second composition comprises silicon nitride.

20. The method of claim 17 wherein the polymeric material primarily comprises carbon and hydrogen.

21. The method of claim 17 wherein the first features, the second features, and the vertically-extending segments are all of about a same horizontal width as one another along the cross-section.

22. The method of claim 21 wherein said same horizontal width is a first horizontal width; wherein the blocks have a second horizontal width along the cross-section; and wherein the second horizontal width is at least about double the first horizontal width.

23. A method of forming an assembly, comprising:
providing a triplet structure over a substrate, the triplet structure comprising a pair of first features and a second feature between the first features of said pair of first features;
providing a first material over the triplet structure such that the first material comprises a vertically-extending segment, and comprises a horizontally-extending segment which extends outwardly from the vertically-extending segment;
providing a second material over the horizontally-extending segment and in contact with the vertically-extending segment; and
performing an etching process to remove the second feature and the vertically-extending segment.

24. The method of claim 23 wherein:
the triplet structure is a first triplet structure, the horizontally-extending segment is a first horizontally-extending segment, and the vertically-extending segment is a first vertically-extending segment;
a second triplet structure is further provided over the substrate simultaneously with the first triplet structure,
the second triplet structure comprises a pair of third features and a fourth feature between the pair of third features,
a third material is further provided over the second triplet structure such that the third material comprises a second vertically-extending segment and a second horizontally-extending segment which extends outwardly from the second vertically-extending segment, the first horizontally-extending segment and the second horizontally-extending segment are merged with each other,
a fourth material is further provided over the second horizontally-extending segment in contact with the second vertically-extending segment, and
the etching process removes the fourth feature and the second vertically-extending segment.

* * * * *